US007826300B2

(12) United States Patent
Moon et al.

(10) Patent No.: US 7,826,300 B2
(45) Date of Patent: Nov. 2, 2010

(54) SEMICONDUCTOR MEMORY APPARATUS

(75) Inventors: Hyung-Wook Moon, Ichon (KR); Jeong-Woo Lee, Ichon (KR); Won-Jun Choi, Ichon (KR)

(73) Assignee: Hynix Semiconductor Inc. (KR)

( * ) Notice: Subject to any disclaimer, the term of this patent is extended or adjusted under 35 U.S.C. 154(b) by 101 days.

(21) Appl. No.: 12/347,055

(22) Filed: Dec. 31, 2008

(65) Prior Publication Data

US 2010/0091599 A1 Apr. 15, 2010

(30) Foreign Application Priority Data

Oct. 14, 2008 (KR) ..................... 10-2008-0100552

(51) Int. Cl.
*G11C 8/00* (2006.01)

(52) U.S. Cl. ............................ 365/230.03; 365/230.06

(58) Field of Classification Search ............ 365/230.03, 365/230.06

See application file for complete search history.

(56) References Cited

U.S. PATENT DOCUMENTS 5,483,497 A 1/1996 Mochizuki et al.
6,556,506 B2 * 4/2003 Naven .................. 365/230.03
6,614,698 B2 9/2003 Ryan et al.
6,789,175 B2 9/2004 Ryan et al.
7,724,602 B2 * 5/2010 Hur et al. .................... 365/226
2009/0157994 A1 * 6/2009 Hampel et al. ............. 711/168
2010/0142244 A1 * 6/2010 Kim et al. ..................... 365/51

FOREIGN PATENT DOCUMENTS

JP 09-265775 7/1997

* cited by examiner

*Primary Examiner*—Tuan T. Nguyen
(74) *Attorney, Agent, or Firm*—Baker & McKenzie LLP

(57) ABSTRACT

A semiconductor memory apparatus includes first and second bank blocks, a mode generator configured to generate a chip select mode signal used to control an operational mode of the first and second bank blocks, and a controller configured to drive the first and second bank blocks in response to the chip select mode signal, first and second select signals, and a predetermined address signal that are used to control driving of the first and second bank blocks, wherein the controller receives the chip select mode signal having a level used to determine a single chip mode to control operation of the first and second bank blocks in one rank unit, and the first and second bank blocks are selectively activated by using the predetermined address signal.

15 Claims, 4 Drawing Sheets

SEMICONDUCTOR MEMORY APPARATUS

CROSS-REFERENCES TO RELATED APPLICATION

The present application claims priority under 35 U.S.C. 119(a) to Korean application number 10-2008-0100552, filed on Oct. 14, 2008, in the Korean Intellectual Property Office, which is incorporated herein by reference in its entirety as if set forth in full.

BACKGROUND

1. Technical Field

The embodiments described herein relate to a semiconductor memory apparatus, and, more particularly, to a semiconductor memory apparatus capable of controlling a rank and a bank block.

2. Related Art

In general, in a semiconductor memory apparatus, a rank represents a unit memory chip controlled by one chip select signal and having an individual function. A single rank or a plurality of ranks can be employed according to the structure of the semiconductor memory apparatus. In order to activate the rank, a chip select signal 'CS' or a chip enable signal 'CE' can be used. Accordingly, each rank is attached to a printed circuit board (PCB) in the form of a unit memory chip having a plurality of semiconductor memory cells and is connected to a panel through a plurality of connectors. Thus, all memory cells belonging to the same rank share buses for chip select signals, commands, and address signals. Accordingly, when an MRS command is transferred through an address bus, DRAM apparatus provided in the same rank are set to the same operation mode.

Meanwhile, in a semiconductor memory apparatus driving a plurality of ranks by using a plurality of chip select signals, respectively, it is difficult to drive the plural ranks as multiple ranks or a single rank by using one chip select signal.

SUMMARY

A semiconductor memory apparatus capable of driving a plurality of ranks as one bank block is described herein.

In one aspect, a semiconductor memory apparatus includes first and second bank blocks, a mode generator configured to generate a chip select mode signal used to control an operational mode of the first and second bank blocks, and a controller configured to drive the first and second bank blocks in response to the chip select mode signal, first and second select signals, and a predetermined address signal that are used to control driving of the first and second bank blocks, wherein the controller receives the chip select mode signal having a level used to determine a single chip mode to control operation of the first and second bank blocks in one rank unit, and the first and second bank blocks are selectively activated by using the predetermined address signal.

In another aspect, a semiconductor memory apparatus includes first and second bank blocks, each including a plurality of banks, a mode generator configured to generate a bank mode signal and a chip select mode signal to control an operational mode, and a controller configured to control activation of the first and second bank blocks according to a level of first and second chip select signals when the chip select mode signal is activated, to control the activation of the first and second bank blocks by using a predetermined address signal if the chip select mode signal is deactivated, and to selectively control precharge of the first and second bank blocks in response to the bank mode signal in a precharge mode.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
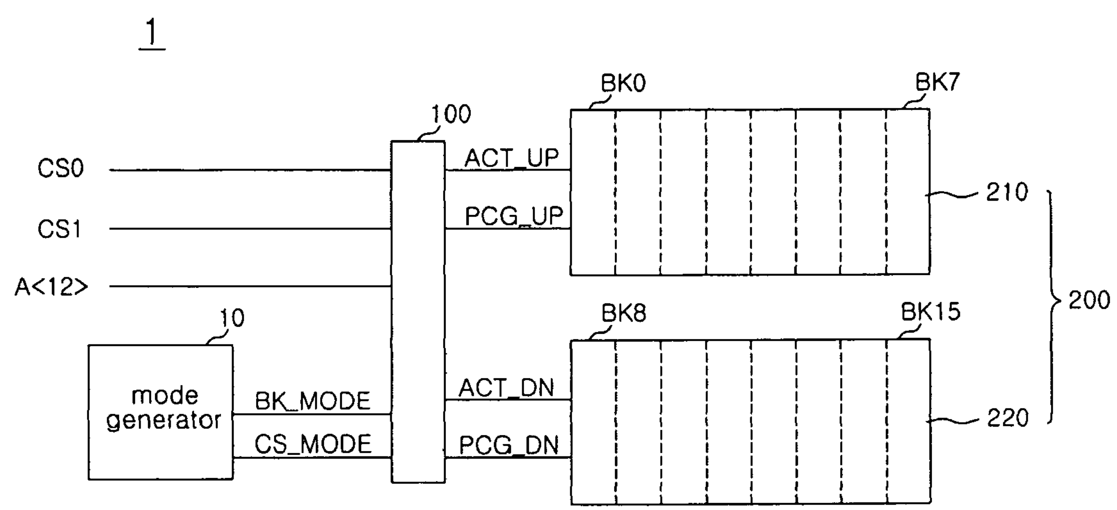
FIG. 1 is a schematic block diagram of an exemplary semiconductor memory apparatus according to one embodiment.

FIG. 1 is a schematic block diagram of an exemplary semiconductor memory apparatus according to one embodiment. In FIG. 1, the semiconductor memory apparatus 1 can include a mode generator 10, a controller 100, and a memory bank block 200.

The mode generator 10 can be configured to control an operational mode of the semiconductor memory apparatus 1 according to an external command. For example, the mode generator 10 can be configured to generate a bank mode signal 'BK_MODE' and a chip select mode signal 'CS_MODE' used to control the number of banks to be driven and a chip control mode. Here, the mode generator 10 can use a mode register set (MRS).

The controller 100 can be configured to generate first and second active signals 'ACT_UP' and 'ACT_DN' and first and second precharge signals 'CG_UP' and PCG_DN in response to first and second chip select signals 'CS0' and 'CS1' supplied from an external apparatus, a predetermined address signal 'A<12>', the bank mode signal 'BK_MODE', and the chip select mode signal 'CS_MODE'. In particular, even if the first and second chip select signals 'CS0' and 'CS1' having an activated level are supplied to the controller 100, the controller 100 can perform a control operation in various chip control modes (or rank modes) by using the address signal 'A<12>'.

The memory bank block 200 can include a first bank block 210 and a second bank block 220. The first bank block 210 can be activated by the first chip select signal 'CS0', and the second bank block 220 can be activated by the second chip select signal 'CS1'. In addition, the first bank block 210 and the second bank block 220 can be designated as an up-bank block and a down-bank block, respectively, according to the alignment of the first and second bank blocks 210 and 220.

However, if two chip select modes (hereinafter, referred to as "dual-chip mode") are used, the first and second bank blocks 210 and 220 can be designated as a first rank and a second rank, respectively.

The first bank block 210 can include first to eighth banks BK0 to BK7, and the second bank block 220 can include ninth to sixteenth banks BK8 to BK15.

A dual-chip-mode semiconductor memory apparatus supporting two ranks must use both of the two chip select signals 'CS0' and 'CS1' in default. Accordingly, the first bank block 210 and the second bank block 220 can be individually used as the first rank and the second rank. However, the first bank block 210 and the second bank block 220 must be driven as individual unit chips supporting individual operations (e.g., read, write, precharge, etc.). For example, two ranks that individually operate according to two chip select signals are driven. Since each rank can include 8 banks, the first to eighth banks BK0 to BK7 and the ninth to sixteenth banks BK8 to BK15 can be individually driven in response to two chip select signals 'CS0' and 'CS1', as described above. Accordingly, in a semiconductor memory apparatus using both of the two chip select signals 'CS0' and 'CS1', driving two ranks as one rank (hereinafter, referred to as "single chip mode") is complex and difficult. However, the address signal 'A<12>' can be used instead of the first and second chip select signals 'CS0' and 'CS1'.

Accordingly, the first and second bank blocks 210 and 220 can be individually driven as the first and second ranks by the first and second chip select signals 'CS0' and 'CS1'. In addition, the first and second bank blocks 210 and 220 can be driven as one unit memory chip, that is, a single chip by using the address signal 'A<12>'. For example, the address signal 'A<12>' can be a redundancy address signal that is not used to designate a memory cell of the memory bank block 200.

In FIG. 1, the first and second bank blocks 210 and 220 can be simultaneously activated as a single chip according to a logic level of the address signal 'A<12>'. Here, the memory blocks, which can be driven when the operational mode of a chip is supplied, can operate as a signal memory block. Even if one memory block is driven, the memory block can operate in various bank modes, such as a 4-bank mode, an 8-bank mode, and a 16-bank mode. For purpose of explanation, a semiconductor memory apparatus supporting the 4-bank mode and the 8-bank mode will be representatively described. Thus, in the case of the dual-chip mode in the semiconductor memory apparatus 1, the first and second bank blocks 210 and 220 operate in the 8-bank mode. In addition, in the case of the single chip mode, the first and second bank blocks 210 and 220 can operate in the 8-bank mode or the 16-bank mode. In the 8-bank mode, the first bank BK0 of the first bank block 210 can cooperate with the ninth bank BK8 of the second bank block 220.

As described above, a semiconductor memory apparatus 1 is capable of selectively driving bank blocks using the address signal 'A<12>' instead of two chip select signals 'CS0' and 'CS1' if the chip select mode signal 'CS_MODE' is at a low level. For example, when the chip select mode 'CS_MODE' is at a low level, that is, the single chip mode is selected, the semiconductor memory apparatus 1 can drive the bank blocks as a single chip driven by one chip select signal according to a logic level of the address signal 'A<12>'. However, if the chip select mode signal 'CS_MODE' becomes a high level, and if the first and second bank blocks 210 and 220 are driven in response to the first and second chip select signals 'CS0' and 'CS1', the first and second bank blocks 210 and 220 can be driven as in the dual-chip mode.

Figure 2:
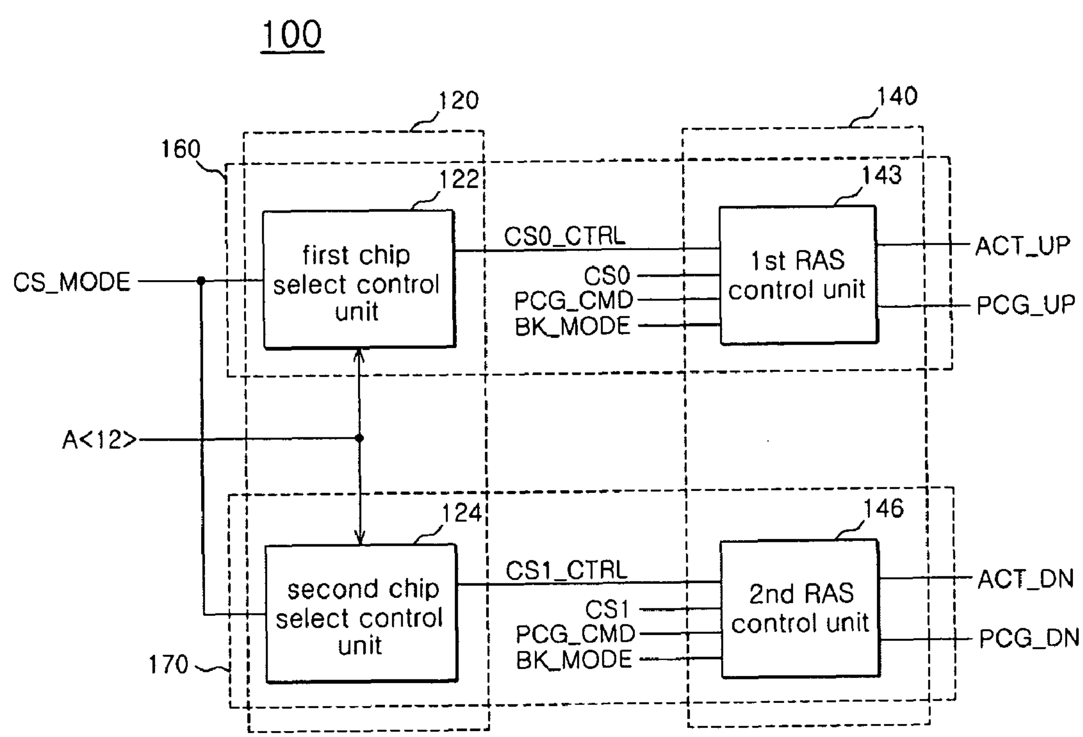
FIG. 2 is a schematic block diagram of an exemplary controller capable of being implemented in the apparatus of FIG. 1 according to one embodiment.

FIG. 2 is a schematic block diagram of an exemplary controller capable of being implemented in the apparatus of FIG. 1 according to one embodiment. In FIG. 2, the controller 100 can include a chip select control block 120 and an RAS control block 140.

The chip select control block 120 can include first and second chip select control units 122 and 124. For example, the first chip select control unit 122 can be configured to generate a first chip select control signal 'CS0_CTRL' in response to the chip select mode signal 'CS_MODE' and the address signal 'A<12>'. In addition, the second chip select control unit 124 can be configured to generate a second chip select control signal 'CS1_CTRL' in response to an inverted level of the chip select mode signal 'CS_MODE' and the address signal 'A<12>'.

The first bank block 210 or the second bank block 220 can be selectively driven according to a logic level of the address signal 'A<12>' when the chip select mode signal 'CS_MODE' is at a low level. This is similar to the principle in which an up-bank block or a down-bank block can be selectively driven in a semiconductor memory apparatus employing a single rank mode (or single chip mode).

The RAS control block 140 can include a first RAS control unit 143 and a second RAS control unit 146. For example, the first RAS control unit 143 can be configured to generate the first active signal 'ACT_UP' and the first precharge signal 'CG_UP' in response to the first chip select control signal 'CS0_CTRL', the first chip select signal 'CS0', the precharge command signal 'PCG_CMD', and the bank mode signal 'BK_MODE'. In addition, the second RAS control unit 146 can be configured to generate the second active signal 'ACT_DN' and the second precharge signal 'PCG_DN' in response to the second chip select control signal 'CS1_CTRL', the second chip select signal 'CS1', the precharge command 'PCG_CMD', and the bank mode signal 'BK_MODE'.

Although not shown in the drawings, the precharge command signal 'PCG_CMD' can be provided from a command decoder in response to a precharge mode.

The controller 100 can include a first bank block controller 160 and a second bank block controller 170. For example, the first bank block controller 160 can be configured to control a precharge operation and the activation of the first bank block 210 according to a chip set mode and a bank mode. In addition, the second bank block controller 170 can be configured to control a precharge operation and the activation of the second bank block 220 according to the chip set mode and the bank mode.

Accordingly, the first active signal 'ACT_UP' and the second active signal 'ACT_DN' can be generated according to the level of the address signal 'A<12>'. For example, the first active signal 'ACT_UP' can activate the first bank block 210 (in FIG. 1), and the second active signal 'ACT_DN' can activate the second bank block 220 (in FIG. 1). Accordingly, the first active signal 'ACT_UP' activated according to the level of the address signal 'A<12>' can selectively activate the first bank block 210 (in FIG. 1). Thus, in the single chip mode, the first active signal 'ACT_UP' can activate the first bank block 210 such that the first bank block 210 operates in the 8-bank mode or the 16-bank mode. Accordingly, the semiconductor memory apparatus can operate in the 8-bank mode or the 16-bank mode according to the bank mode. If an up-block or a down-block of the banks is selectively activated according to the level of the address signal 'A<12>', the banks can operate in a 16-bank mode. However, even if only the first active signal 'ACT_UP' is activated, and the second active signal 'ACT_DN' is deactivated, the first bank BK0 of the up-block and the ninth bank BK8 of the down-block can be simultaneously driven so that simultaneous control is possible.

However, in the precharge mode, information about a bank mode is required in order to precharge corresponding bank blocks. Accordingly, the bank mode signal 'BK_MODE' can be added such that the corresponding bank blocks are activated. For example, in the 8-bank mode, all bank blocks can be precharged such that the bank blocks 210 and 220, which have been already activated, can be simultaneously precharged. In the 16-bank mode, only activated bank blocks can be precharged by using a flag signal of the bank information.

Figure 3:
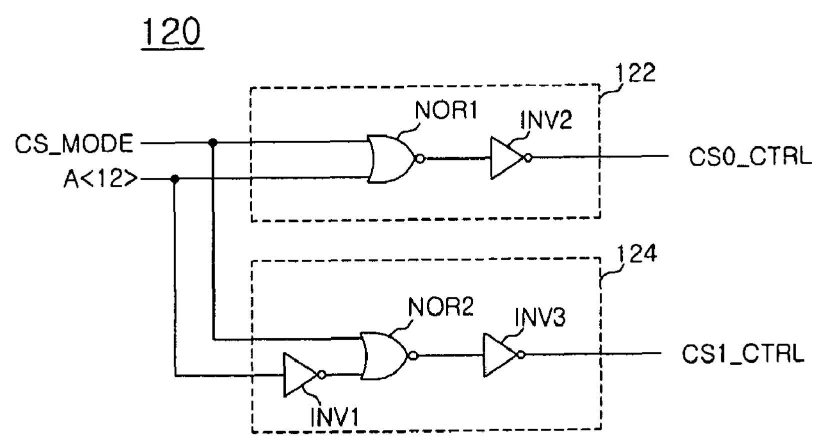
FIG. 3 is a schematic circuit diagram of an exemplary chip select control block capable of being implemented in the controller of FIG. 2 according to one embodiment.

FIG. 3 is a schematic circuit diagram of an exemplary chip select control block capable of being implemented in the controller of FIG. 2 according to one embodiment. In FIG. 3, the chip select control block 120 can include the first and second chip select control units 122 and 124.

The first chip select control unit 122 can include a second inverter INV2 and a first NOR gate NOR1. Thus, the first chip select control unit 122 can generate the first chip select control signal 'CS0_CTRL', which is activated in response to a logic level of the address signal 'A<12>', according to the chip select mode signal 'CS_MODE'. Here, if the chip select mode signal 'CS_MODE' is at a high level, then a present mode can represent that ranks individually operate. If the chip select mode signal 'CS_MODE' is at a low level, then the present mode represents the single chip mode regardless of ranks.

For example, when the chip select mode signal 'CS_MODE' is at a low level, one rank (i.e., a chip) can perform a write operation or a read operation if a write command or a read command is received. This represents that a single operational mode is performed with respect to all bank blocks in response to an external command.

In FIG. 3, when the chip select mode signal 'CS_MODE' and the address signal 'A<12>' are at a low level, the first chip select control unit 122 can generate the deactivated first chip select control signal 'CS0_CTRL' having a low level. In addition, the second chip select control unit 124 can include a first inverter INV1, a second NOR gate NOR2, and a third inverter INV3. When the chip select mode 'CS_MODE' and the address signal 'A<12>' are at a low level, the second chip select control unit 124 can generate the activated second chip select control signal 'CS1_CTRL' having a high level.

Accordingly, when the chip select mode signal 'CS_MODE' is at a low level, the first and second chip select control signals 'CS0_CTRL' and 'CS1_CTRL' can be selectively activated according to the logic level of the address signal A<12>'. When the chip select mode signal 'CS_MODE' has a high level, the first and second chip select control signals 'CS0_CTRL' and 'CS1_CTRL' can be activated regardless of the logic level of the address signal 'A<12>'.

Figure 4:
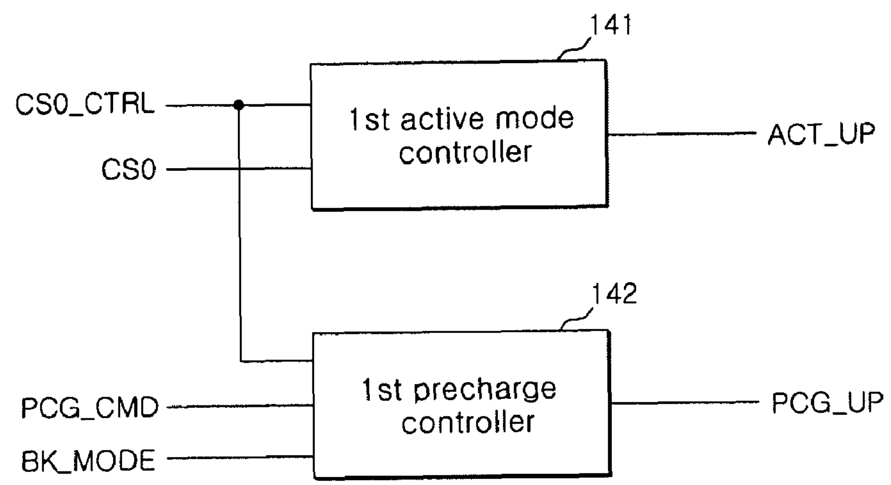
FIG. 4 is a schematic block diagram of an exemplary first RAS control unit capable of being implemented in the controller of in FIG. 2 according to one embodiment.
Figure 5:
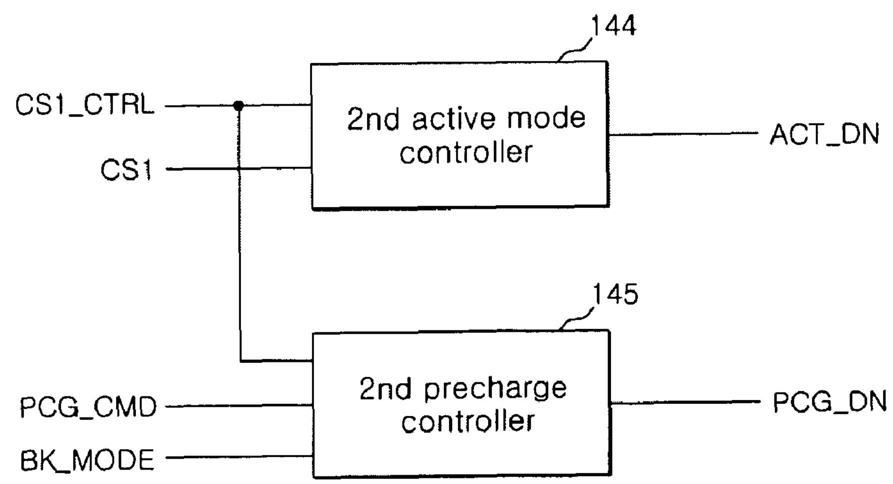
FIG. 5 is a schematic block diagram of an exemplary second RAS control unit capable of being implemented in the controller of FIG. 2 according to one embodiment.

FIG. 4 is a schematic block diagram of an exemplary first RAS control unit capable of being implemented in the controller of in FIG. 2 according to one embodiment, and FIG. 5 is a schematic block diagram of an exemplary second RAS control unit capable of being implemented in the controller of FIG. 2 according to one embodiment. In FIGS. 4 and 5, the first RAS control unit 143 can include a first active mode controller 141 and a first precharge controller 142, and the second RAS control unit 146 can include a second active mode controller 144 and a second precharge controller 145.

In FIG. 4, the first active mode controller 141 can generate the first active signal 'ACT_UP' in response the first chip select control signal 'CS0_CTRL' and the first chip select signal 'CS0'. For example, the first active mode controller 141 can determine the activation of the first active signal 'ACT_UP' based on the level of the first chip select control signal 'CS0_CTRL' even if the first chip select signal 'CS0' is activated. Since the second active mode controller 144 can perform substantially the same operation as that of the first active mode controller 141, except for received signals, details of the second active mode controller 144 will be omitted.

The first precharge controller 142 can generate the first precharge signal 'PCG_UP' in response to the first chip select control signal 'CS0_CTRL', the precharge command signal 'PCG_CMD', and the bank mode signal 'BK_MODE'. Similarly, the second precharge controller 145 generates the second precharge signal 'PCG_DN' in response to the second chip select control signal 'CS1_CTRL', the precharge command signal 'PCG_CMD', and the bank mode signal 'BK_MODE'. Here, the first precharge controller 142 can be different from the second precharge controller 145 in that the first precharge controller 142 and the second precharge controller 145 can receive the first chip select control signal 'CS0_CTRL' and the second chip select control signal 'CS1_CTRL', respectively. Accordingly, only the first precharge controller 142 will be described in detail in order to avoid redundancy.

If the precharge command signal 'PCG_CMD' is activated, the first precharge controller 142 can generate the first precharge signal 'PCG_UP' activated according to the bank mode signal 'BK_MODE' or the first chip select control signal 'CS0_CTRL'. Accordingly, the bank mode signal 'BK_MODE' can represent a flag signal in a bank mode. The bank mode signal 'BK_MODE' can be at a high level in the 16-bank mode, and can be at a low level in the 8-bank mode. Since the 16-bank mode is not supported in the dual-chip mode, the bank mode signal 'BK_MODE' can be at a low level.

Figure 6:
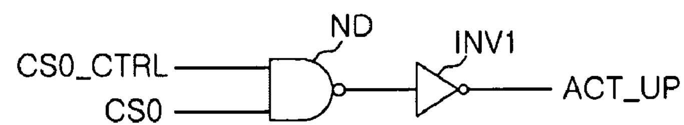
FIG. 6 is a schematic circuit diagram of an exemplary first active mode controller capable of being implemented in the control unit of FIG. 4 according to one embodiment.

FIG. 6 is a schematic circuit diagram of an exemplary first active mode controller capable of being implemented in the control unit of FIG. 4 according to one embodiment. In FIG. 6, the first active mode controller 141 can include a first inverter INV1 and a NAND gate ND. The NAND gate ND performs a NAND gate operation with respect to the first chip select signal 'CS0' and the first chip select control signal 'CS0_CTRL', and the first inverter INV1 inverts an output signal of the NAND gate ND.

In the case of the single chip mode, the first chip select signal 'CS0' can be at a high level. Accordingly, the first active mode controller 141 can generate the deactivated first active signal 'ACT_UP' having a low level in response to the first chip select control signal 'CS0_CTRL' having a low level and the first chip select signal 'CS0' having a high level. In the case of the dual-chip mode, since the first active mode controller 141 can receive the first chip select control signal 'CS0_CTRL' having a high level, the first active mode controller 141 can generate the second active signal 'ACT_DN' in response to the level of the first chip select signal 'CS0'.

Exemplary signal levels of FIGS. 3 to 6 are shown in following Table 1.

TABLE 1

| CS_MODE | A<12> | CS0_CTRL | CS1_CTRL | ACT_UP | ACT_DN |
|---|---|---|---|---|---|
| L | L | L | H | L | H |
| L | H | H | L | H | L |
| H | X (don't care) | H | H | Depending on CS0 level | Depending on CS1 level |
| H | X (don't care) | H | H | Depending on CS0 level | Depending on CS1 level |

In Table 1, the first and second rows represent the single chip mode, and the third and fourth rows represent the dual-chip mode. In the case of the single chip mode, the first bank block 210 and the second bank block 220 can operate as one rank according to a predetermined level of the address signal 'A<12>', and the first chip select control signal 'CS0_CTRL' and the second chip select control signal 'CS1_CTRL' can be selectively activated to control the first bank block 210 and the second bank block 220 as an up-bank block and a down-bank block, respectively. In addition, the first active signal 'ACT_UP' and the second active signal 'ACT_DN' can be activated according to the level of the first and second chip select control signals 'CS0_CTRL' and 'CS1_CTRL'.

In the dual-chip mode, as the first bank block 210 and the second bank block 220 are selectively activated in response to different column commands, the first and second active signals 'ACT_UP' and 'ACT_DN' responding to the level of the first and second chip select signals 'CS0' and 'CS1' can be supplied. In such a dual-chip mode, the first and second active signals 'ACT_UP' and 'ACT_DN' can be supplied regardless of the address signal 'A<12>'. Thus, the memory bank block 200 can be activated in the single chip mode or the dual-chip mode by using the first and second chip select control signals 'CS0_CTRL' and 'CS1_CTRL' and the address signal 'A<12>'.

Figure 7:
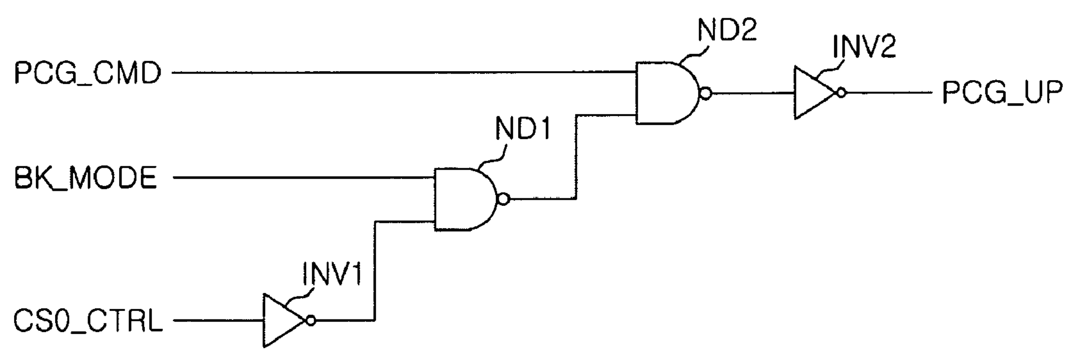
FIG. 7 is a schematic circuit diagram of an exemplary first precharge controller capable of being implemented in the control unit of FIG. 4 according to one embodiment.

FIG. 7 is a schematic circuit diagram of an exemplary first precharge controller capable of being implemented in the control unit of FIG. 4 according to one embodiment. In FIG. 7, the first precharge controller 142 can include first and second inverters IV1 and IV2 and first and second NAND gates ND1 and ND2.

In the dual-chip mode, the first precharge controller 142 can generate the activated first precharge signal 'PCG_UP' in response to the activated precharge command signal 'PCG_CMD'. However, in the single chip mode, when the precharge command signal 'PCG_CMD' is activated, the first precharge controller 142 can generate the activated first precharge signal 'PCG_UP' in response to the bank mode signal 'BK_MODE' or the first chip select control signal 'CS0_CTRL'.

An exemplary 8-bank mode in the single chip mode will be described with reference to FIG. 7.

Since the bank mode signal 'BK_MODE' has a low level, the activated first precharge signal 'PCG_UP' can be generated regardless of the first chip select control signal 'CS0_CTRL'. Although not shown, since the bank mode signal 'BK_MODE' has a low level, the second precharge controller 145 can also generate the activated second precharge signal 'PCG_DN' regardless of the second chip select control signal 'CS1_CTRL'.

An exemplary 16-bank mode in the single chip mode will be described with reference to FIG. 7.

If the bank mode signal 'BK_MODE' has a high level, and the first chip select control signal 'CS0_CTRL' has a high level, then the activated second precharge signal 'PCG_DN' is generated. For example, since one receiving terminal of the first NAND gate ND1 receives a low level signal, the first NAND gate ND1 can generate a high level signal. Accordingly, since both receiving terminals of the second NAND gate 2 receive high level signals, the first precharge signal 'PCG_UP' can become a high level. Similarly, in order to support the 16-bank mode in the single chip mode, a signal having information about the single chip mode and a signal having information about the 16-bank mode are required such that the bank blocks can be precharged.

Although not specifically described, the dual-chip mode can be employed when the ranks 210 and 220 (in FIG. 1) operate in the 8-bank mode. Thus, the first precharge signal 'PCG_UP', which can be activated in response to the low level of the bank mode signal 'BK_MODE' (which is a bank flag signal), can be generated.

Accordingly, a semiconductor memory apparatus can operate in the single chip mode as well as the dual-chip mode. In particular, a redundancy address signal not used in a memory area can be employed as a chip select signal, and the bank mode can be determined by using a flag signal having information about a bank.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A semiconductor memory apparatus, comprising:

first and second bank blocks;

a mode generator configured to generate a chip select mode signal used to control an operational mode of the first and second bank blocks; and a controller configured to drive the first and second bank blocks in response to the chip select mode signal, first and second select signals, and a predetermined address signal that are used to control driving of the first and second bank blocks, wherein the controller receives the chip select mode signal having a level used to determine a single chip mode to control operation of the first and second bank blocks in one rank unit, and the first and second bank blocks are selectively activated by using the predetermined address signal.

2. The semiconductor memory apparatus of claim 1, wherein the predetermined address signal is excluded in designation of a memory cell in the first and second bank blocks.

3. The semiconductor memory apparatus of claim 1, wherein the controller selectively controls the driving of the first and second bank blocks in response to a level of the predetermined address signal even if both of the first and second chip select signals are activated.

4. A semiconductor memory apparatus, comprising:

first and second bank blocks, each including a plurality of banks;

a mode generator configured to generate a bank mode signal and a chip select mode signal to control an operational mode; and a controller configured to control activation of the first and second bank blocks according to a level of first and second chip select signals when the chip select mode signal is activated, to control the activation of the first and second bank blocks by using a predetermined address signal if the chip select mode signal is deactivated, and to selectively control precharge of the first and second bank blocks in response to the bank mode signal in a precharge mode.

5. The semiconductor memory apparatus of claim 4, wherein the predetermined address signal is excluded in designation of a memory cell in the first and second bank blocks.

6. The semiconductor memory apparatus of claim 4, wherein the controller selectively controls activation of the first and second bank blocks in response to a level of the predetermined address signal even if both of the first and second chip select signals are activated.

7. The semiconductor memory apparatus of claim 4, wherein the first and second bank blocks operate in response to a same column command according to the predetermined address signal if the chip select mode signal has a first level.

8. The semiconductor memory apparatus of claim 7, wherein the first and second bank blocks operate in response to column commands applied to the first and second bank blocks regardless of the predetermined address signal if the chip select mode signal has a second level.

9. The semiconductor memory apparatus of claim 4, wherein the controller includes:

a chip select control block configured to generate first and second chip select control signals by using the chip select mode signal and the predetermined address signal; and a RAS control block configured to receive the first and second chip select control signals, the first and second chip select signals, a precharge command signal, and the bank mode signal to generate first and second active signals and first and second precharge signals.

10. The semiconductor memory apparatus of claim 9, wherein the chip select control block includes:

a first chip select control unit configured to generate the first chip select control signal in response to the chip select mode signal and the predetermined address signal; and a second chip select control unit configured to generate the second chip select control signal in response to an inverted level of the chip select mode signal and the predetermined address signal.

11. The semiconductor memory apparatus of claim 9, wherein the RAS control block includes:

a first RAS control unit configured to control precharge and activation of the first bank block; and a second RAS control unit configured to control precharge and activation of the second bank block.

12. The semiconductor memory apparatus of claim 11, wherein the first RAS control unit generates the first active signal in response to the first chip select control signal.

13. The semiconductor memory apparatus of claim 12, wherein the second RAS control unit generates the second active signal in response to the second chip control signal.

14. The semiconductor memory apparatus of claim 11, wherein the first and second RAS control units generate the first and second precharge signals according to the bank mode signal and the first or second chip select control signal if the precharge command signal is activated.

15. The semiconductor memory apparatus of claim 14, wherein the first and second RAS control units simultaneously or selectively activate the first and second precharge signals in response to the bank mode signal.

* * * * *